United States Patent [19]

Ackley

[11] 4,349,905
[45] Sep. 14, 1982

[54] TAPERED STRIPE SEMICONDUCTOR LASER

[75] Inventor: Donald E. Ackley, Los Altos, Calif.

[73] Assignee: Hewlett-Packard Company, Palo Alto, Calif.

[21] Appl. No.: 171,080

[22] Filed: Jul. 22, 1980

[51] Int. Cl.³ .............................................. H01S 3/19
[52] U.S. Cl. .................................................. 372/46
[58] Field of Search ................... 331/94.5 H; 372/45, 372/46

[56] References Cited

U.S. PATENT DOCUMENTS 4,251,780  2/1981  Scifres et al. ................. 331/94.5 H

OTHER PUBLICATIONS

Kawaguch et al., "Planar Stripe with Waist and/or Notch (SWAN) Injection Laser," *IEEE Journal of Quantum Electronics,* vol. QE-16, No. 1, Jan. 1980, pp. 78-84.

Yonezu et al., "High Optical Power Density Emission from a "Window-Stripe" AlGaSa Double-Heterostructure Laser", *Appl. Phys. Lett.* 34(10), 15 May 1979, pp. 637-639.

Burns et al., "Optical Waveguide Parabolic Coupling Horns", *Appl. Phys. Lett.* vol. 30 No. 1, 1 Jan. 1977, pp. 28-30.

*Primary Examiner*—James W. Davie
*Attorney, Agent, or Firm*—Jon R. Stark

[57] ABSTRACT

A stripe semiconductor laser is provided in which the active stripe region is tapered in width. Tapering permits high power operation and a low current density threshold for lasing, while preventing oscillation in unwanted lateral modes.

3 Claims, 3 Drawing Figures

TAPERED STRIPE SEMICONDUCTOR LASER

BACKGROUND OF THE INVENTION

Stripe semiconductor lasers are well known devices in which the injection of charge carriers across one or more semiconductor junctions results in stimulated emission. Mirrored surfaces on the device are provided to form a cavity in which the stimulated emission will produce lasing when the injected current density is above a certain threshold level. By constructing the device with multiple layers of varying band-gap materials, the region in which lasing occurs may be confined, in the direction normal to the junction plane, to a well-defined active layer. The active lasing region may be limited laterally by restricting charge injection to a stripe extending between the mirrored surfaces.

An ideal device would require a low threshold current density while exhibiting linearity in the relation between light output and current above the threshold. High output power and stable intensity distribution patterns are also desirable.

Devices known in the prior art generally produce more than one lateral mode of oscillation in the junction plane at high driving currents. This is undesirable because it leads to non-linearities, commonly called "kinks", in the relation between light output and current, and complex and unstable far-field intensity distribution patterns. The severity of this problem increases with increasing stripe width.

Some prior devices have employed a narrow stripe, e.g., less than 10 μm, to avoid kinks. However, a narrow stripe produces a significant detrimental increase in the threshold current density, and reduces the attainable output power of the device.

Another prior attempt to eliminate unwanted transverse oscillation modes was the so-called SWAN laser proposed by H. Kawaguchi and J. Ikegami (*IEEE Journal of Quantum Electronics*, Volume QE-16, No. 1, January 1980). This device used a main stripe with narrower "waists" or notches at the mirror surfaces. The abrupt changes in stripe width were intended to act as lossy filters for unwanted modes. However, these devices suffer the disadvantage that the abrupt expansion of the stripe width may cause significant conversion into unwanted higher order modes of oscillation.

Yet another prior art attempt to achieve high power laser devices is concerned with a method of stripe fabrication. The stripe is defined by diffusion of Zn, of sufficient depth to penetrate the active layer, into a completely n-type semiconductor structure. This creates a step in the refractive index across the stripe. An advantage of this technique is that an area adjacent to each mirror surface may be left undiffused, so that absorption near the mirrors is reduced. As reported by H. Yonezu, et al. (*Applied Physics Letters*, Volume 34, No. 10, May 1979), this has been found to increase the threshold power level which would cause catastrophic mirror damage, permitting operation of the laser at high power levels than devices with conventional stripes. However, these devices can produce unwanted lateral modes which lead to complex far-fields.

Additional prior art which may be relevant can be found in the field of passive waveguides. Passive waveguides are used for transmission of optical signals in integrated optical devices. Within this context, tapered coupling horns have been suggested as passive couplers between waveguides. These passive devices prevent mode conversion during passage of a wave from one waveguide to another. However, these waveguides are not active devices, such as lasers, and there has been no suggestion in prior art to provide a tapered width in an active semiconductor laser stripe.

SUMMARY OF THE INVENTION

In accordance with the illustrated preferred embodiments, the present invention provides a stripe semiconductor laser in which the stripe is tapered in width. A narrow stripe section provides lateral mode control, while a wider section permits high power operation and a low current density threshold for lasing. Tapering between wide and narrow sections substantially prevents conversion of the fundamental transverse mode into unwanted higher order modes. In one preferred embodiment, a narrow stripe section near a mirrored face of the laser reduces the image size.

DESCRIPTION OF THE PREFERRED EMBODIMENT

Figure 1:
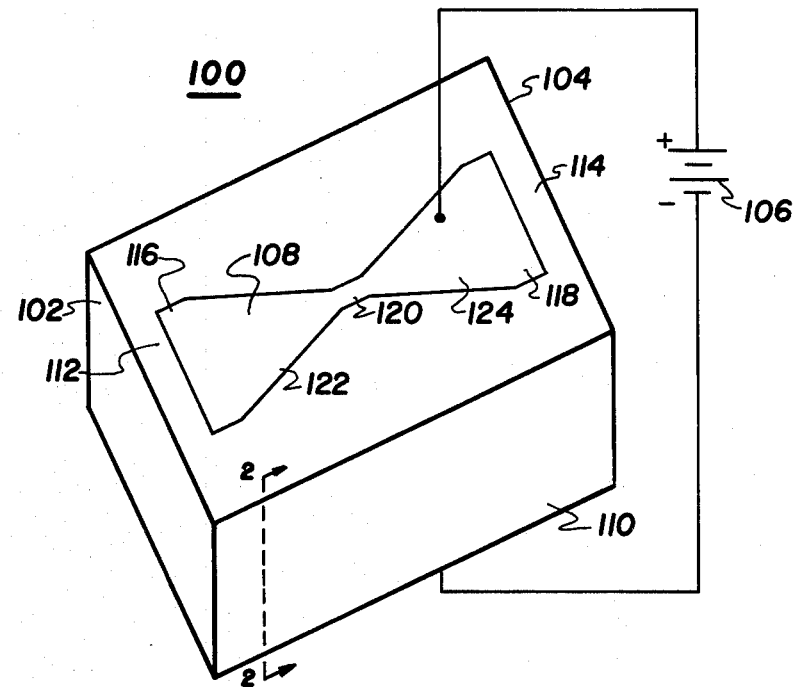
FIG. 1 shows a semiconductor laser in which the stripe has a tapered width.

In FIG. 1 there is shown a stripe semiconductor laser 100 with a pair of mirrored surfaces 102 and 107. Current from a voltage source 106 is injected into laser 100 via a stripe 108, which in the preferred embodiment is formed by diffusion of a p-dopant, preferably Zn or Be, into a heterostructure 110, taken for exemplary purposes as being composed of n-type semiconductors. Regions 112 and 114, adjacent to the mirror faces 102 and 104, are left undiffused to reduce absorption near the mirrors, and thus increase the threshold power level which would cause catastrophic mirror damage.

A pair of wide sections 116 and 118 of stripe 108 allow a low threshold current density for lasing, and permit high power operation of the laser. Width of about 20 μm is preferred for these sections. A narrower section 120 of stripe 108, preferably about 2–3 μm in width, is provided to preclude oscillation in unwanted modes, so that only the fundamental transverse oscillation mode is obtained. Section 102 is connected to wide sections 116 and 118 by a pair of tapered stripe sections 122 and 124, which prevent conversion to higher order transverse modes of the wide sections.

Figure 2:
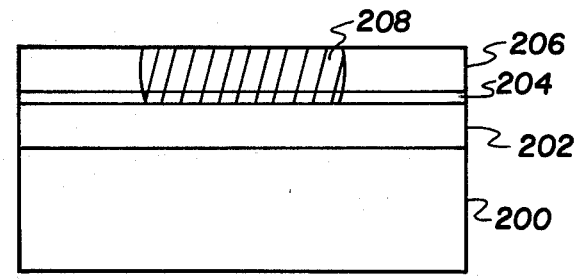
FIG. 2 shows a cross-section of the laser of FIG. 1, taken in a plane parallel to a mirror surface, passing through the stripe.

In the preferred embodiment shown in FIG. 2, layers 200, 202, 204, and 206 form a completely n-type heterostructure. Layer 200 is an n-type substrate, while layers 202 and 206 are preferably $Al_{0.3}Ga_{0.7}As$. The active lasing region is substantially confined to layer 204, which is preferably $Al_{0.06}Ga_{0.94}As$. In the preferred embodiment, stripe 208 is formed by diffusion of a p-dopant, such as Zn, of sufficient depth to penetrate the active layer.

Figure 3:
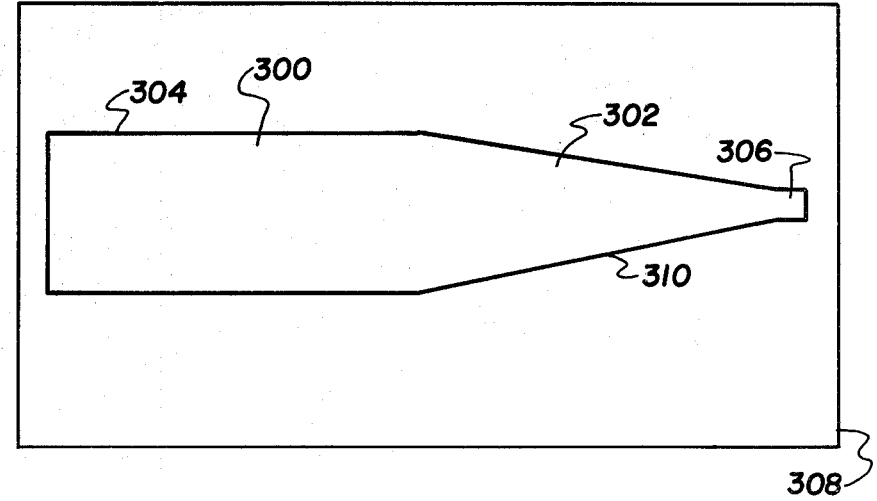
FIG. 3 is a top view of another semiconductor laser having a tapered stripe.

In FIG. 3, a stripe 300 has a single tapered section 302 connecting a wide section 304 with a narrow section 306. In this embodiment, the narrow stripe width near a mirror surface 308 reduces the minimum image size, which is advantageous when a tightly focussed beam is required.

Another embodiment uses the stripe shape of FIG. 3, but is operated in a so-called "leaky" mode. In this embodiment, the stripe 300 has a lower refractive index than the surrounding regions so that a negative refractive index step is encountered at a boundary 310. Light is refracted out of the stripe, or "leaks", at the boundary into the surrounding region. This has the effect of diluting the intensity of light incident on mirror 308, which contributes to preventing mirror damage, while the stripe shape provides lateral mode control.

In any of these embodiments, tapering of the stripe provides lateral mode control which leads to simple and stable far-field intensity distribution patterns. An additional advantageous result is that wide stripe sections may be used to lower the threshold current density for lasing, without creating an adverse effect on the far-field pattern. Also, the wide stripe sections permit operation at high power levels. A further advantageous result of the embodiment in FIG. 3 is that a small near-field image size may be obtained without detrimental effects on the threshold current density or on the stability of the intensity distribution.

I claim:

1. A semiconductor laser comprising:
a plurality of layers of semiconducting material including an active layer in which charge recombination and emission of optical radiation are induceable by injection of charge carriers into said active layer;
a first mirrored face and a second mirrored face at opposite ends of said active layer;
stripe means extending between said first and second mirrored faces for laterally confining the optical radiation and the charge carriers, said stripe means having a first region of tapered width for substantially preventing lasing in more than one mode, said stripe means having lower refractive index than one of said layers, for permitting leaky mode operation of said laser; and
electrode means for supplying electrical current.

2. A semiconductor laser comprising:
a plurality of layers of semiconducting material including an active layer in which charge recombination and emission of optical radiation are induceable by injection of charge carriers into said active layer;
a first mirrored face and a second mirrored face at opposite ends of said active layer;
stripe means extending between said first and second mirrored faces for laterally confining the optical radiation and the charge carriers, said stripe means having a first region of tapered width for substantially preventing lasing in more than one mode, said stripe means including a p-dopant diffused region of sufficient depth to penetrate said active layer, the length of said p-dopant diffused region of said stripe means being less than the distance between said first and second mirrored faces for providing at least one region adjacent one of said first and second mirrored faces which is not p-dopant diffused for increasing the threshold power level which would cause catastrophic mirror damage; and
electrode means for supplying electrical current.

3. A semiconductor laser as in claim 2 wherein said stripe means further comprises:
a second region of tapered width positioned between said first region of tapered width and said second mirrored face, said second region of tapered width having greatest width in the direction of said second mirrored face, and said first region of tapered width having greatest width in the direction of said first mirrored face.

* * * * *

UNITED STATES PATENT AND TRADEMARK OFFICE
CERTIFICATE OF CORRECTION

PATENT NO. : 4,349,905

DATED : September 14, 1982

INVENTOR(S) : Donald E. Ackley

It is certified that error appears in the above–identified patent and that said Letters Patent are hereby corrected as shown below:

Column 1, line 59, "high" should read -- higher --.

Signed and Sealed this

Eighth Day of March 1983

[SEAL]

Attest:

GERALD J. MOSSINGHOFF

Attesting Officer — Commissioner of Patents and Trademarks